(12) United States Patent
Peris Domingo et al.

(10) Patent No.: US 9,391,558 B2
(45) Date of Patent: Jul. 12, 2016

(54) SOLAR TRACKER WITH REFRACTION-BASED CONCENTRATION

(71) Applicant: Compañía Valenciana De Energías Renovables, s. A., Valencia (ES)

(72) Inventors: Gonzalo Bernabé Peris Domingo, Valencia (ES); Sergio Ehlis Pirretas, Barcelona (ES); Jordi Mulet Mas, Sant Climent De Llobregat (ES); Eduardo Fernández Lacruz, Torrente (ES)

(73) Assignee: Compañia Valenciana de Energias Renovables, s. A., Valencia (ES)

( * ) Notice: Subject to any disclaimer, the term of this patent is extended or adjusted under 35 U.S.C. 154(b) by 0 days.

(21) Appl. No.: 14/377,533

(22) PCT Filed: Feb. 7, 2013

(86) PCT No.: PCT/ES2013/070067
§ 371 (c)(1),
(2) Date: Aug. 8, 2014

(87) PCT Pub. No.: WO2013/117790
PCT Pub. Date: Aug. 15, 2013

(65) Prior Publication Data
US 2015/0022897 A1    Jan. 22, 2015

(30) Foreign Application Priority Data

Feb. 8, 2012  (ES) .................................. 201230136

(51) Int. Cl.
*G02B 27/10*    (2006.01)
*H01L 31/00*    (2006.01)
(Continued)

(52) U.S. Cl.
CPC . *H02S 40/00* (2013.01); *F24J 2/08* (2013.01); *F24J 2/5233* (2013.01); *F24J 2/5417* (2013.01);
(Continued)

(58) Field of Classification Search
CPC ............ F24J 2/5417; F24J 2/08; H02S 20/32; Y02E 10/52
USPC .......... 359/619, 642, 853; 126/600, 603, 605, 126/698, 684, 696; 136/259
See application file for complete search history.

(56) References Cited

U.S. PATENT DOCUMENTS

| 4,440,155 A | 4/1984 | Maloof et al. |
| 2008/0295825 A1 | 12/2008 | Kleinwachter |

(Continued)

FOREIGN PATENT DOCUMENTS

| DE | 29703890 | 4/1997 |
| GB | 1590841 | 6/1981 |

(Continued)

OTHER PUBLICATIONS

PCT International Search Report in PCT/ES2013/070067, mailed Apr. 24, 2013, 4 pages.

(Continued)

*Primary Examiner* — Tuyen Tra
(74) *Attorney, Agent, or Firm* — Maier & Maier, PLLC (57) ABSTRACT

The invention comprises: a structure (3) supporting at least one refraction-based concentration element (1) and at least one collector (2) positioned parallel to one another; and first actuation means operatively connected so as to pivot the structure in relation to a base (4) about a first axis (E1) parallel to the concentration element and to the collector, in order to track a relative movement of the sun. The concentration element is fixed in a stationary position on the structure and the collector is supported in said structure by at least two rocker arms (5) positioned parallel to one another and connected at the ends thereof to form an articulated quadrilateral mechanism. In addition, second actuation means are operatively connected so as to pivot the arms in relation to the structure about respective second axes (E2) adjacent to the concentration element and perpendicular to the first axis, so that the collector can at any time be positioned at a maximum concentration point.

6 Claims, 6 Drawing Sheets

(51) Int. Cl.
*F24J 2/38* (2014.01)
*H01L 31/042* (2014.01)
*F24J 2/08* (2006.01)
*F24J 2/52* (2006.01)
*H01L 31/054* (2014.01)
*G02B 19/00* (2006.01)
*H01L 31/052* (2014.01)
*F24J 2/54* (2006.01)
*F24J 2/07* (2006.01)

(52) U.S. Cl.
CPC ........ *G02B 19/0014* (2013.01); *G02B 19/0042* (2013.01); *H01L 31/0525* (2013.01); *H01L 31/0543* (2014.12); *H02S 20/32* (2014.12); *F24J 2002/075* (2013.01); *F24J 2002/5458* (2013.01); *Y02E 10/47* (2013.01); *Y02E 10/52* (2013.01)

(56) References Cited

U.S. PATENT DOCUMENTS

2008/0308094 A1 12/2008 Johnston
2013/0139805 A1 6/2013 Peris Domingo et al.

FOREIGN PATENT DOCUMENTS

NL 2005101 1/2012
WO WO-2012/020146 2/2012

OTHER PUBLICATIONS

PCT International Preliminary Report in Patentability in PCT/ES2013/070067, mailed Aug. 21, 2014, 9 pages.

Fig.5

SOLAR TRACKER WITH REFRACTION-BASED CONCENTRATION

CROSS REFERENCE TO RELATED APPLICATIONS

This is a national stage entry of International Patent Application No. PCT/ES2013/070067, filed Feb. 7, 2013, which claims priority to Spanish Patent Application No. 201230136, filed Feb. 8, 2012.

FIELD OF THE TECHNOLOGY

This invention relates to a solar tracker with refraction-based concentration comprising one or more refraction based concentration elements installed on a movable structure, which concentrate the sun's rays towards one or more respective collectors also installed on the movable structure. A first means of actuation move the movable structure with regard to a base to track relative movement of the sun in a first direction, and a second means of actuation move the collector(s) with regard to the movable structure to track relative movement of the sun in a second direction.

BACKGROUND OF THE INVENTION

Document GB 1590841 discloses a solar tracker with refraction-based concentration that comprises a movable structure upon which one or more linear concentration lenses are fixed and one or more linear collectors, mutually parallel to each other and rigidly interconnected by a structure. Each one of the linear collectors is arranged to capture the concentrated sun's rays by one of the linear concentration lenses. This solar tracker further comprises means for actuation connected operatively so as to pivot said movable structure with regard to a support structure around a first axis parallel to the linear concentration lenses and to the linear collectors to track relative movement of the sun in one direction (seasonal movement). The lens or set of lenses is also rotary in regard to the movable structure around an axis which is transverse thereto, perpendicular to the aforementioned first axis, to track solar movement during the day. One disadvantage to the solution proposed is that the length between the linear concentration lenses and the collectors remains fixed, which makes it impossible to change thereby and to optimize the radiation concentration conditions on these collectors. Moreover the angle of the lens cannot provide a suitable concentration in the collector, in its different positions.

Through document US 2008/0295825 a lens system is disclosed with a focal length correction used for the concentration of solar radiation on a collector, which provides a means to move a set of linear concentration lenses away or towards a fixed collector, or to move a collector away or towards a lens or a fixed set of lenses, using an oscillating circular movement of said set of lenses (rotation around the center of a rotary disk or bars). In certain phases of the movement, this type of oscillating circular movement has the disadvantage of not making the most of the concentration ability of the lenses, which generates shadows.

SUMMARY OF THE INVENTION

This invention discloses a solar tracker with refraction-based concentration, which comprises a structure which supports at least one refraction concentration element and at least one collector that is mutually parallel thereto. The aforementioned refraction concentration element is fixed in a stationary position in this structure, while the collector is supported on said structure by at least two rocker arms which are mutually parallel to each other forming an articulated quadrilateral mechanism. The solar tracker comprises a first means for actuation connected operatively so as to pivot the structure with regard to a base around a first axis parallel to this refraction concentration element and to the collector in order to track movement relative to the sun, and a second means of actuation operatively connected so as to pivot said rocker arms with regard to the structure around respective second axes perpendicular to said first axis to place the linear collector at a point of maximum sun ray concentration.

Thus, through the movement of the structure with regard to the base, which is fixed relative to the ground, an imaginary plane that comprises a longitudinally symmetrical axis of the refraction concentration element, and a longitudinally symmetrical axis of the collector may be positioned at different times throughout the day, parallel to the sun's rays, and through the movement of the collector's rocker with regard to the structure, and subsequently in relation to the refraction concentration element, at different times throughout the day it is possible to place the linear collector at a point of maximum sun ray concentration, or what would be the same, at the linear focus of the refraction concentration element, especially with a concentration lens.

In one embodiment, the lens is a linear Fresnel concentration lens, and the linear collector may be a thermal or photovoltaic powered collector. Other refraction concentration elements may be prisms or spherical lenses. In one embodiment, at least two concentric circular guide elements are fixed in the structure with the first axis, which are separated from each other and arranged around the collector and the rocker arms. These circular guide elements are coupled to a support and guide device installed on the base.

For example, the aforementioned support and guiding device may comprise, for each circular guide element, at least two external rollers supported on the base over those that support the external track of the circular guide element and at least one interior roller supported in the base and supported upon an interior track of said circular guide elements.

In this case, the aforementioned first means of actuation may comprise a flexible traction element, such as a roller chain, a cable or something similar, connected to the structure and supported on sections of an external circular surface of the circular guide element located on opposite sides thereof, and a traction mechanism activated by an electric motor and arranged to selectively pull said flexible traction element in opposite directions. Alternatively, the first means of actuation may comprise a toothed ring sector fixed to one of the circular guide elements and an electric motor operatively connected to rotate a pinion meshed with said sprocket sector.

In another embodiment, the structure comprises axis support which supports a pivot shaft in a coaxial position with the first axis, and said pivot shaft is rotationally supported on support members attached to the base. In this case, the first means of actuation may comprise, for example, an electric motor connected operatively to cause the pivot shaft to rotate selectively in opposing directions.

Regardless of the carrier system, guide system and actuation system controlling movements of the structure, the solar tracker may include a single refraction concentration element attached in a stationary position to the structure and a single collector supported in the structure by the corresponding rocker arms, or a plurality of refraction concentration elements (lenses, prisms, or other suitable optical elements, know in the Prior Art) mutually parallel each other attached to respective stationary positions in the structure and a plurality of collectors supported in the structure by the corresponding rocker arms, with one of the collectors associated with each of the refraction concentration elements.

In one embodiment, the structure is made of steel or aluminum, and it comprises a plurality of longitudinal and transverse structural members connected to each other, and a plurality of reinforcing bars and struts connected to said longitudinal and transverse members forming triangulations. Thus, the structure is endowed with extraordinary rigidity and lightness, and it behaves in an exceptionally strong manner to the stress of flexing and twisting which occurs in part to the weight of the structure itself, but fundamentally, due to the wind loads to which it may be exposed during its operation.

The design of the structure makes it possible for it to be fully built in a workshop, with conventional materials and technologies, and subsequently for it to be moved in its completely assembled state to the definitive site. In this way, in situ operations on the structure may be minimized, which implies a minimization of the costs.

Preferably, the solar tracker assembly is auto-stable, so that in the event of a failure or breakage of the means of actuation, the structure gradually returns by itself, to a position of stability, thus avoiding impact accidents, sudden rollovers, or breakage in other parts of the installation.

In short, the solar tracker with refraction-based concentration of this invention offers the following advantages:

Tracking the sun with regard to an axis through the rotation of the lens support structure.

Positioning the solar energy collector at all times at the point of maximum concentration through the timely rotation of the rocker arms.

The solar tracker may be placed in any orientation with regard to the sun optimizing solar collection, since it is not necessary that it be aligned with the north-south or east-west axes.

The structure that holds the lens has the maximum of strength and rigidity against wind with minimum use of materials and great simplicity in its manufacture and assembly.

The embodiment that includes the guided rotation using the circular guide elements involves great simplification of the actuations to achieve the movements: For example, a geared motor with a chain or sprocket for rotating the structure and one or more linear actuator devices to move the rockers.

The embodiment that includes the rotation using a pivot shaft makes it possible to simplify and economize the actuations to achieve the movements: For example, a geared motor with chain or sprocket for rotating the structure and a linear actuator to move the rockers.

A casing or liner is provided covering the structure which holds the lens in the entire extent of one or more serially connected structures, and closed on the ends. With this improved structural behavior against wind, an increase in the interior temperature of the coating with respect to the outside is achieved, improving significantly the thermal behavior of the collector.

BRIEF DESCRIPTION OF THE DRAWINGS

The foregoing and other characteristics and advantages will become more evident from the following description of a few examples of embodiments with reference to the appended drawings, in which.

DETAILED DESCRIPTION OF A FEW EXAMPLES OF EMBODIMENTS

Figure 1:
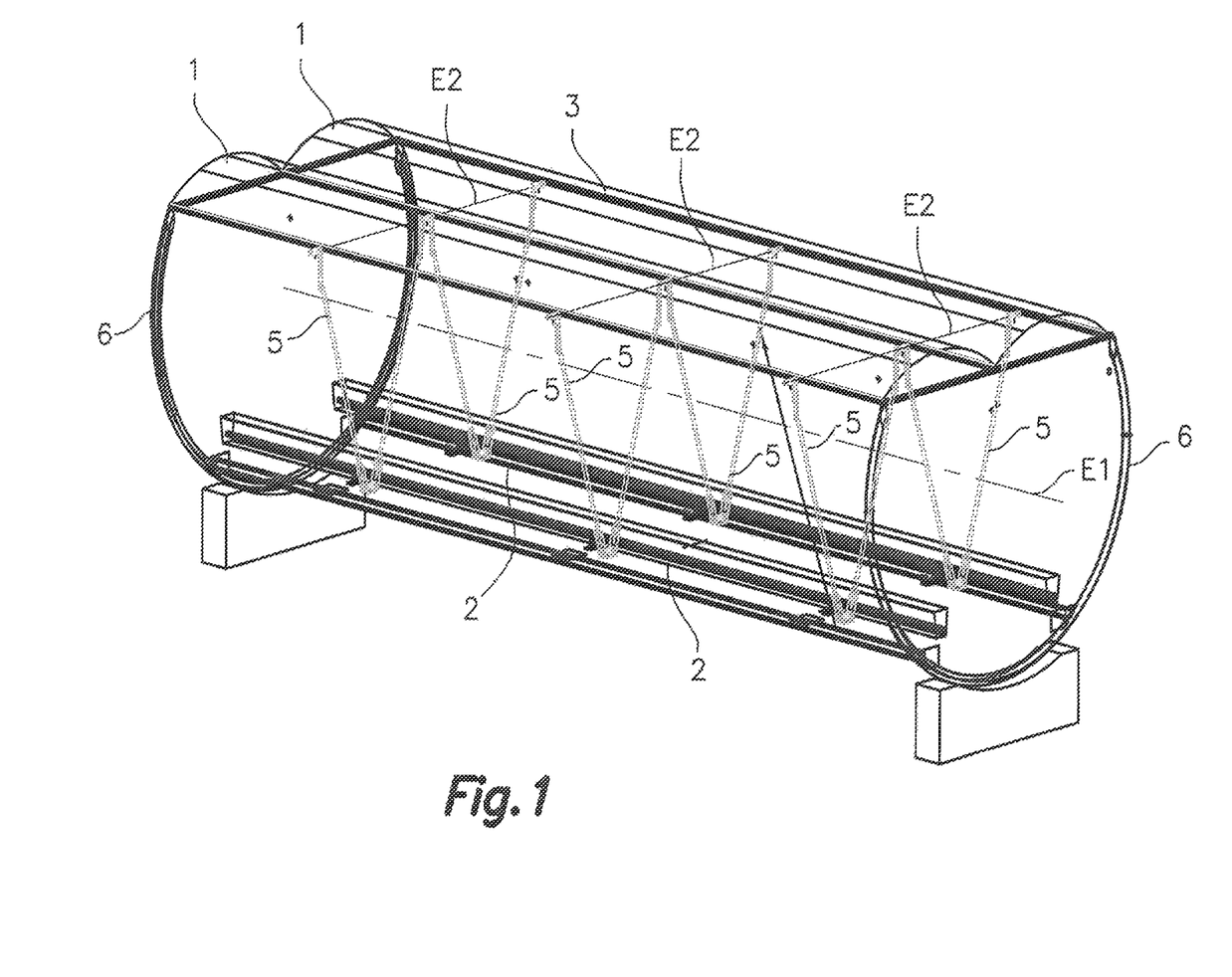
FIG. 1 is a view in perspective, simplified, of a solar tracker with refraction-based concentration according to an embodiment of this invention.

FIG. 1 shows a first example of an embodiment of a solar tracker with refraction-based concentration, according to the invention comprising a structure 3 which supports at least one refraction concentration element 1 and at least one collector 2 that is mutually parallel thereto, and a first means of actuation operatively connected so as to pivot said structure 3 with respect to a base 4 around a first axis E1 parallel to said refraction concentration element 1 and to the collector 2 to track relative movement of the sun, according to that disclosed in GB 1590841.

In accordance with the proposal of this invention said refraction concentration element 1 (in the example two units, parallel to each other, longitudinal, for Ex. linear concentration lenses) is attached in a stationary position in said structure 3 and the collector 2 (in this example of two units, parallel to each other) is supported in said structure 3 by at least two rocker arms 5 which are mutually parallel to each other forming a articulated quadrilateral mechanism, and a second means of actuation are operatively connected so as to pivot the rocker arms 5 in relation to the structure 3 around the respective second axes E2 which are adjacent to the refraction concentration element 1 and perpendicular to the first axis, E1 so that the collector 2 can at any time be positioned at a maximum concentration point.

Figure 2:
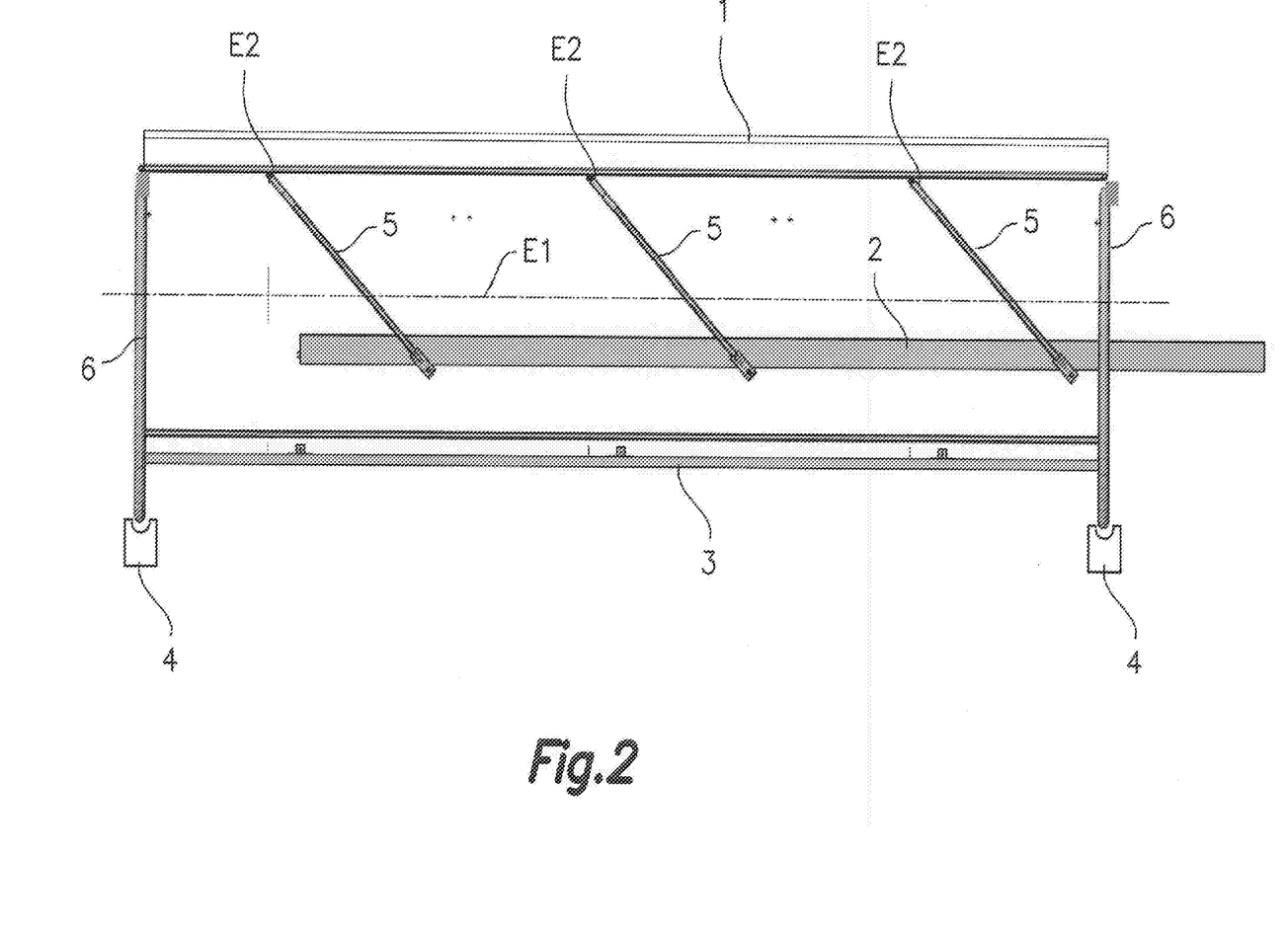
FIG. 2 is a lateral top view, simplified, of the tracker showing a first relative shift of the collector, in relation to the set of refraction concentration elements, approximating both elements for the purpose of optimizing the concentration of energy, concentrated on the collector, for a first arrangement relative to the solar tracker with regard to the sun.
Figure 3:
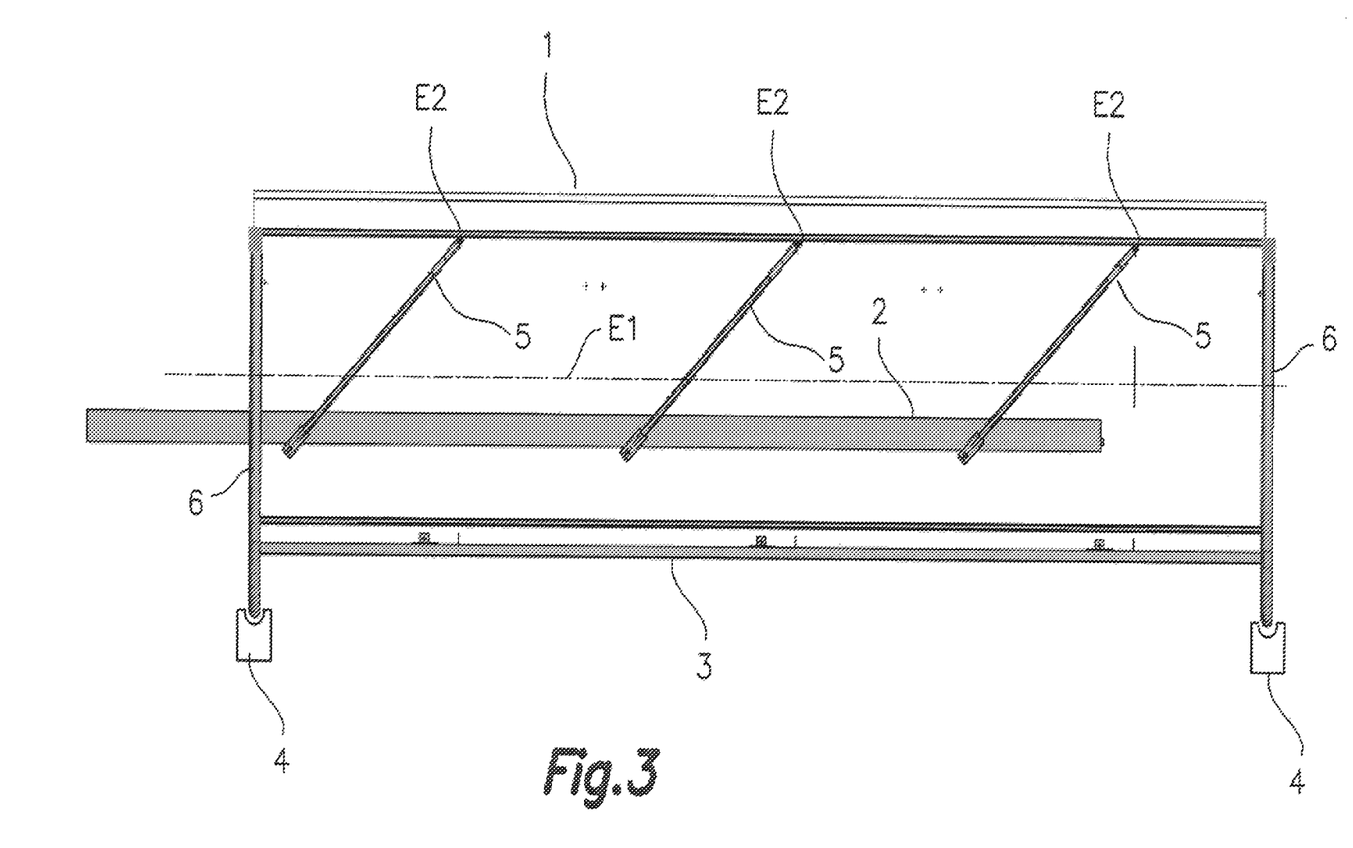
FIG. 3, is a view equivalent to the previous view, but showing the shift of the collector from the opposite side, equally modifying the distance between the se of refraction concentration element and the collector, to respond to a second arrangement relative to the solar tracker with regard to the sun.

As shown in FIGS. 1, 2, and 3, the structure 3, has two concentric circular guide elements 6 attached to the first axis E1, separated from each other and arranged around the collectors 2 and the rocker arms 5, and said circular guide elements 6 are coupled to a support and guide device installed onto said base 4.

Figure 1A:
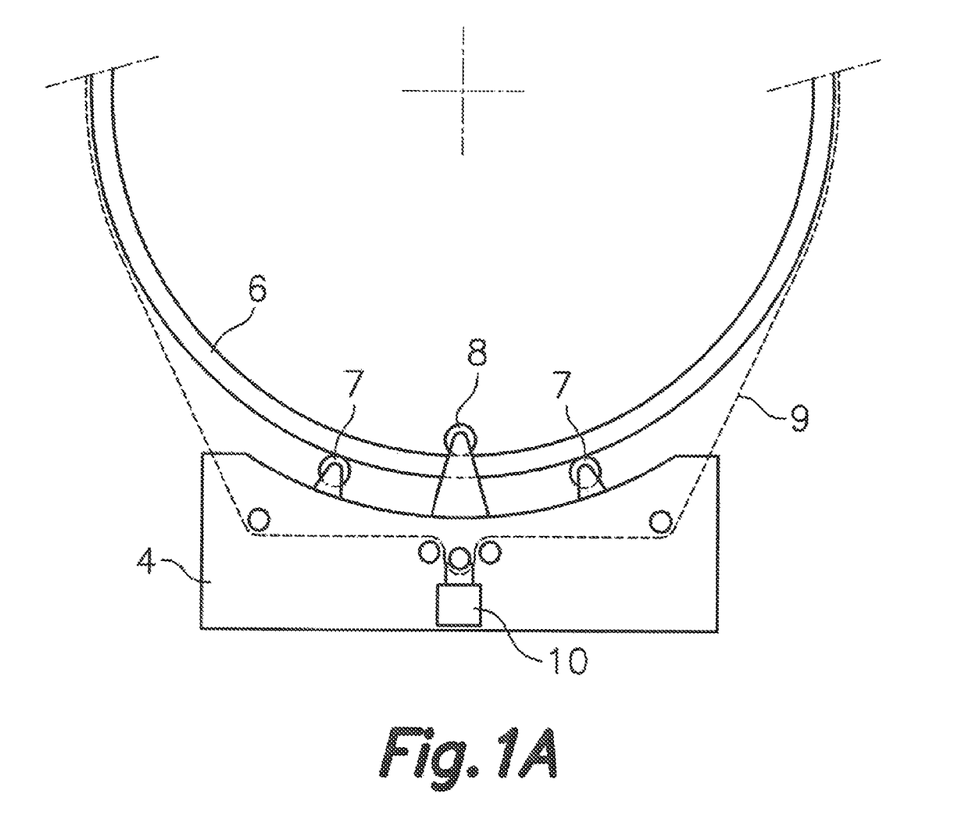
FIG. 1A is a partial diagram of a front view that shows a possible actuation of the tracker of FIG. 1.

In accordance with an embodiment illustrated in FIGS. 2 and 3 in diagram form and in FIG. 1A with greater detail, the support and guide device comprises at least two external rollers 7 for each circular guide element 6 supported on the base 4 and which are supported upon an external track of the circular guide element 6 and at least one inner roller 8 supported on the base 4 and which is supported upon an inner track of said circular guide elements 6. As shown in said FIG. 1A the first means of actuation may comprise a flexible traction element 9 (such as a chain or similar item) connected to the structure 3 and supported upon sections of an external circular surface of the circular guide element 6 on opposing sides thereto and a traction mechanism actuated by an electric motor 10 and arranged to pull said flexible traction element 9 selectively in opposite directions.

Figure 4:
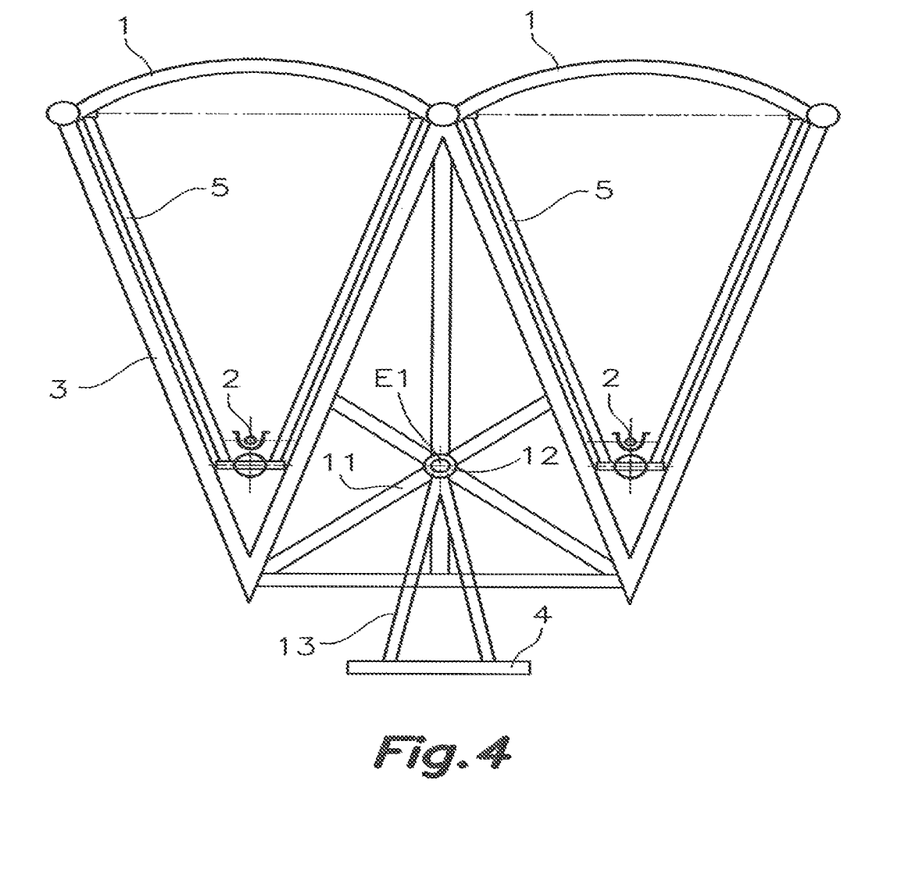
FIG. 4 shows an alternative example of construction of the structure holding the set of rotary lenses, with respect to a central longitudinal axis.

In the example of the embodiment of FIG. 4, the alternative structure 3 comprises axis supports 11 that support a coaxial pivot shaft 12 to the first axis E1, and said pivot shaft 12 is rotationally supported upon support members 13 attached to the base 4. In this case, the first means of actuation comprise a conventional electric motor (not shown) operatively connected to cause the rotation of the pivot shaft 12 selectively in opposite directions.

The solar tracker explained to this point may comprise a plurality of said refraction concentration elements 1, appended to respective stationary positions in the structure 3 and a plurality of said collectors 2, supported to said structure 3 by a plurality of rocker arms 5, with one of the collectors 2 associated with each of the refraction concentration elements 1.

Figure 5:
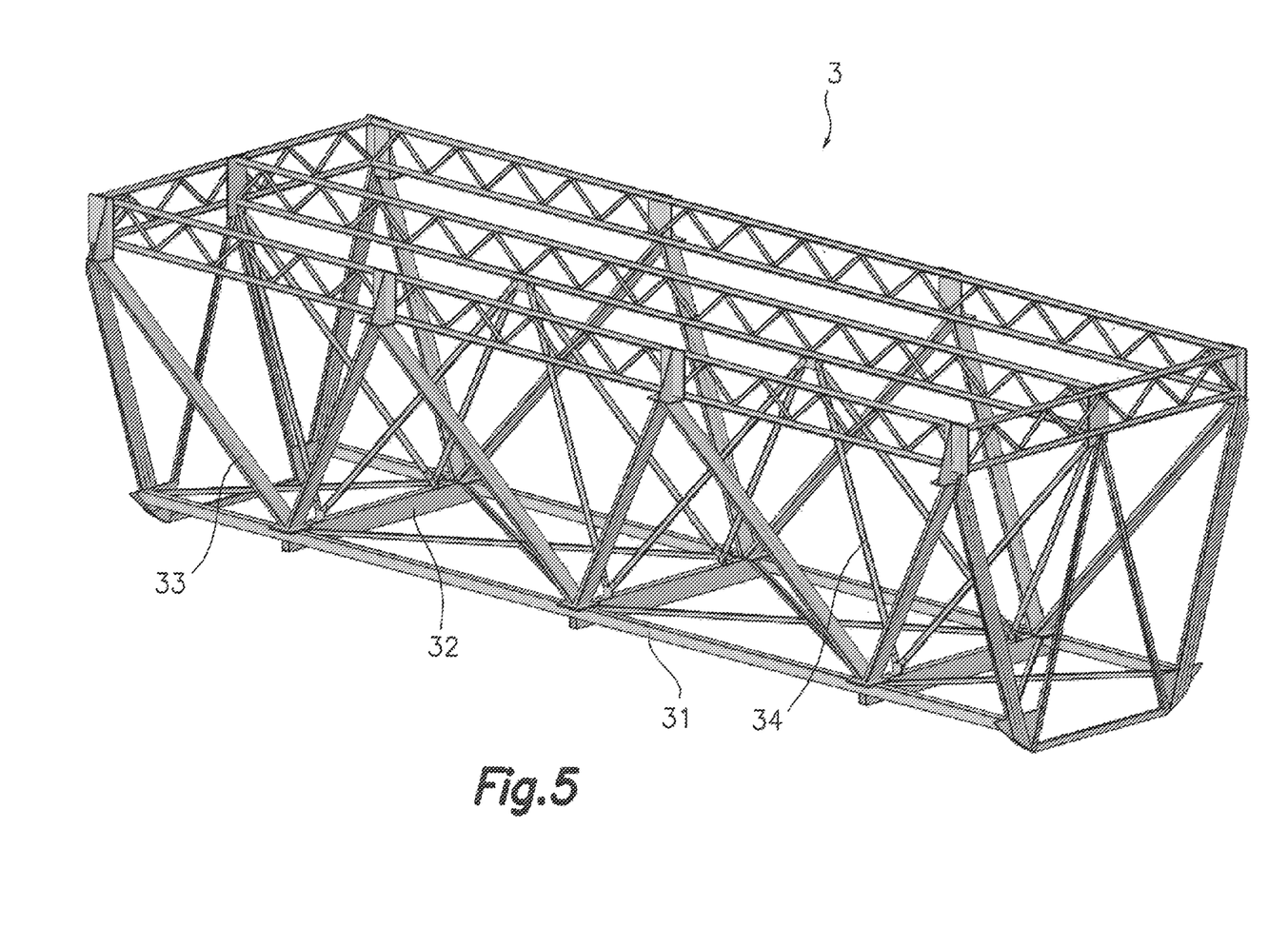
FIG. 5 is a view in perspective that shows a structure applicable to the solar tracker according to the construction of FIG. 1 or according to the construction of FIG. 4.

As shown in FIG. 5, for the purpose of improving the structural 3 strength described, we have planned for it to comprise a plurality of longitudinal members 31 and transverse members 32 connected to each other, and a plurality of reinforcement bars 33 and reinforcing struts 34 connected to said longitudinal and transverse members 31, 32, forming triangulations.

At the top of the structure 3 is a rectangular-shaped upper frame in the form of a lattice which supports the refraction concentration elements 1, and therefore it must remain under a minimal distortion range, to ensure the correct positioning of the sunspot. This frame is built using circular sections, thereby contributing to the assembly with a minimum of deformations, regardless of the assembly's position in the structure 3, and the direction of the wind loads that the lens receives.

Below said upper rectangular frame is a "W-shaped" section in which the rocker arms 5 and the collector 2 move. The triangular spatial arrangement of the bars and the reinforcing struts 33, 34 provide a completely rigid core with structural sections of minimal section. The side bars have a great oriented inertia so that the deformation thereof when the structure 3 is tilted is the smallest possible for the inertia/weight ratio of the section.

In the lower part of the structure 3 there is a lower rectangular frame, which plays a double role. On one hand, it integrally links the compartments in the "W-shaped" section, providing consistency to the assembly; and on the other hand it imparts torsional rigidity to the assembly, which is a critical point for proper rotational behavior of the structure. This lower rectangular frame acts as a rigid screen, which is essential to make tracking movement possible, also using steel minimal sections.

In the examples shown, the refraction-based concentration elements 1 are linear concentration lenses and the collectors 2 are linear collectors. Nevertheless, it is planned that the refraction-based concentration elements may alternatively be prisms, concentric lenses, or other optical elements capable of performing a concentration of sun's rays by refraction, and the collectors may be punctual collectors.

One skilled in the art will be able to introduce modifications and variations to the embodiments shown and described without departing from the scope of the invention as defined in the appended Claims.

The invention claimed is:

1. A solar tracker with refraction-based concentration, comprising:
    a structure which supports at least one refraction concentration element and at least one collector that is mutually parallel thereto;
    a first means of actuation operatively connected so as to pivot the structure with respect to a base around a first axis E1 parallel to the refraction concentration element and to the collector in order to track movement relative to the sun, wherein the refraction concentration element is fixed in a stationary position on the structure at the top thereof and the collector is supported on the structure by at least two mutually parallel rocker arms connected to its ends forming an articulated quadrilateral mechanism; and
    a second means of actuation operatively connected so as to pivot the rocker arms with regard to the structure around a respective second axis E2, adjacent to the refraction-based concentration element and perpendicular to said first axis E1 to place the collector at any time, at a point of maximum concentration by moving the collector by said pivot to the rocker arms,
    wherein said structure comprises a rectangular-shaped upper frame which supports said refraction-concentration elements and said rocker arms are pivotally attached to said upper frame and movable within the structure.

2. The solar tracker according to claim 1 wherein the first means of actuation comprises an electric motor operatively connected to cause the pivot shaft to rotate selectively in opposing directions.

3. The solar tracker according to claim 1, wherein a plurality of said refraction concentration elements are fixed in respective stationary positions on the structure and a plurality of the collectors are supported on the structure by a plurality of rocker arms, with one of the collectors associated with each of the refraction concentration elements, wherein the structure further comprises:
    a plurality of longitudinal members and transverse members connected to each other,
    a W-shaped section below said upper rectangular-shaped upper frame formed by plurality of reinforcement bars and reinforcing struts connected to said longitudinal and transverse members forming triangulations within which said plurality of rocker arms move by the pivot of the rocker arms, and
    a lower rectangular frame which integrally links the compartment in the W-shaped section and impart torsional rigidity thereof.

4. The solar tracker according to claim 3 wherein said rectangular-shaped upper frame is in the form of a lattice built of circular sections which supports said plurality of refraction-concentration elements.

5. The solar tracker according to claim 1, wherein the structure comprises a casing or liner that covers the structure and a surface of the refraction concentration element is left free.

6. The solar tracker according to claim 1, wherein the refraction concentration element is a linear concentration lens and the collector is a linear collector.

* * * * *